United States Patent [19]

Jaffe

[11] 4,066,962
[45] Jan. 3, 1978

[54] METAL DETECTING DEVICE WITH MAGNETICALLY INFLUENCED HALL EFFECT SENSOR

[75] Inventor: Wolfgang Jaffe, Roselle Park, N.J.

[73] Assignee: The Singer Company, New York, N.Y.

[21] Appl. No.: 748,434

[22] Filed: Dec. 8, 1976

[51] Int. Cl.² ............................................. G01R 33/12
[52] U.S. Cl. .................................... 324/208; 324/235; 338/32 H; 200/61.09
[58] Field of Search .................... 324/34 PS, 34 D, 41, 324/45, 46; 338/32 R, 32 H; 323/94 H; 335/2, 205–207; 200/61.09

[56] References Cited

U.S. PATENT DOCUMENTS

| 3,179,856 | 4/1965 | Kuhrt et al. | 324/45 |
| 3,187,127 | 6/1965 | Hess | 324/34 RS |
| 3,340,467 | 9/1967 | Ha | 324/41 |

FOREIGN PATENT DOCUMENTS

| 359,462 | 2/1962 | Switzerland | 324/45 |

Primary Examiner—Robert J. Corcoran
Attorney, Agent, or Firm—William V. Ebs; Edward L. Bell; Robert E. Smith

[57] ABSTRACT

A solid state Hall effect sensor is disposed between two magnets having their fields in quadrature with flux from the magnets at least partially cancelling in the Hall element to thereby enable a ferrous element relatively movable with respect to the magnets and sensor to control the output of the sensor.

5 Claims, 3 Drawing Figures

METAL DETECTING DEVICE WITH MAGNETICALLY INFLUENCED HALL EFFECT SENSOR

BACKGROUND OF THE INVENTION

1. Field of the Invention

The invention relates to Hall effect sensors. More particularly, the invention is directed to a novel arrangement of a Hall effect sensor and permanent magnets for use in conjunction with a ferrous element relatively movable with respect to the magnets and sensor.

2. Description of the Prior Art

Solid state Hall effect sensors including a Hall element, signal conditioning circuit, transfer circuitry and logic output interfacing circuitry all integrated on a tiny single chip have been in use for some time. Such chips are commonly encapsulated in plastic or ceramic or are enclosed in metal or plastic to form a package with protruding electrical terminals and the packages made commercially available for various applications according to the particular circuitry provided on the chips in association with the Hall element.

Solid state Hall effect sensors can be used effectively to detect relative movement of a magnet with respect thereto and can also be so used to detect relative movement of a ferrous element which is not magnetized provided the ferrous element is located in an air gap between the sensor and a magnet. There are instances, however, where it is desirable to be able to detect relative movement of a Hall effect sensor and a non-magnetized ferrous element which cannot, because of physical constraints, pass through an air gap between the sensor and a magnet. Heretofore, this could not be accomplished reliably because of the weak response obtained with other arrangements and is a prime object in this invention to provide a device suited to the purpose.

SUMMARY OF THE INVENTION

In accordance with the invention, a solid state Hall effect sensor is disposed between a pair of magnets having their fields in quadrature and flux from the magnets at least partially cancelling in the Hall element of the sensor such that relative movement of the sensor and a ferrous element in a direction parallel to the broad plane of the sensor is effective to significantly change the flux density in the sensor and to thereby affect its output voltage accordingly.

DESCRIPTION OF THE PREFERRED EMBODIMENT

Figure 1:
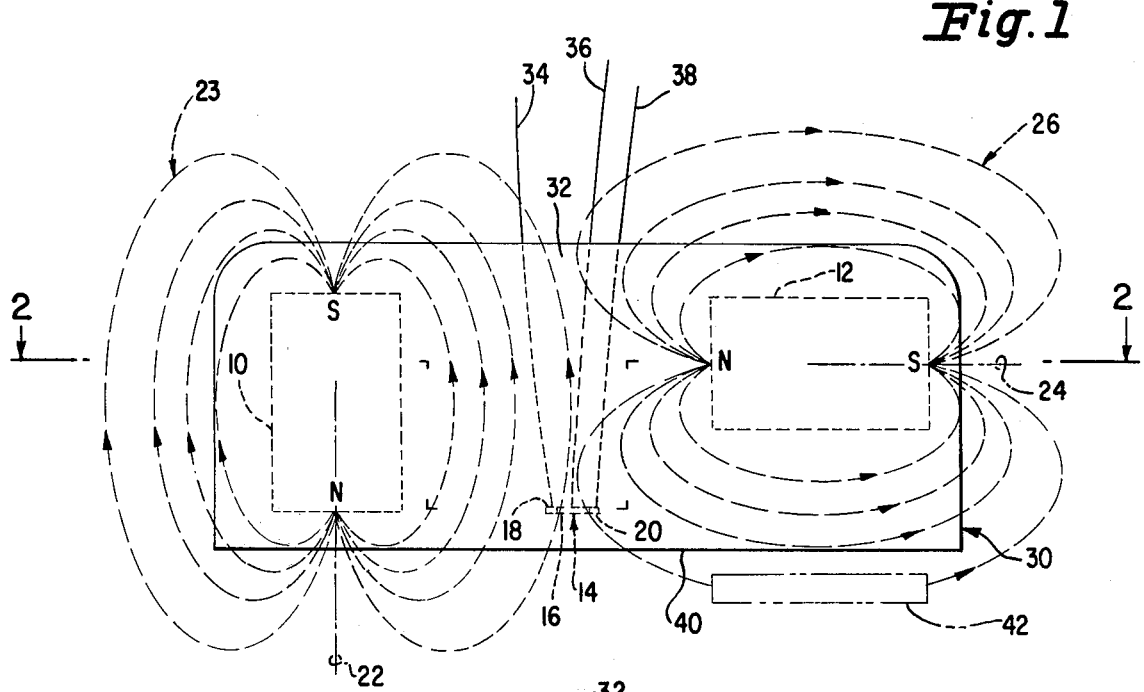
FIG. 1 is a front elevational view of a dual magnet Hall effect device according to the invention.

Referring to the drawings, reference characters 10 and 12 designate permanent magnets which are preferably of the rare earth type. The magnets are oriented with their magnetic fields mutually perpendicular, and a solid state Hall effect sensor 14, is located between the magnets in a position such that flux lines from the two magnets pass in opposite direction transversely through the broad plane of a Hall element 16. Sensor 14 may be a linear output Hall effect sensor of conventional design comprising a Hall element (Hall generator) and linear amplifier interfacing with an output transistor on a single silicon chip, or such sensor 14 may be a conventional digital output Hall effect sensor, that is, like the linear device except for the inclusion in the chip of a trigger circuit for transforming the linear output of the Hall element into a digital output. As shown, the sensor is disposed with chip surfaces 18 and 20 perpendicular to the axis 22 of the magnetic field 23 of magnet 10, and parallel to the axis 24 of the magnetic field 26 of the other magnet 12, and is located below axis 24 of magnet 12. The sensor and magnets are held in assembled relationship as a unitary device 30 in a plastic or ceramic binder 32. Wire input, ground and output leads 34, 36 and 38 respectively connect with the sensor to supply a constant input voltage and provide an output signal control voltage according to the flux density in the Hall elements.

Because flux from each of the magnets 10 and 12 extends in a different direction through the Hall element 16 there is a cancelling of flux in the element to an extent depending upon the relative strengths of the magnets an their position with respect thereto. Preferably the relative strength of the magnets is such and the sensor is so disposed as to cause magnet 12 to contribute the greater portion of the flux in element 16. It is also preferable that the pole at the lower end of magnet 10 and the sensor 14 be in close proximity to the bottom surface 40 of device 30, and that the axis 24 of magnet 12 be offset a substantial distance from the plane of sensor 14 as shown, for example in FIG. 1.

Figure 2:
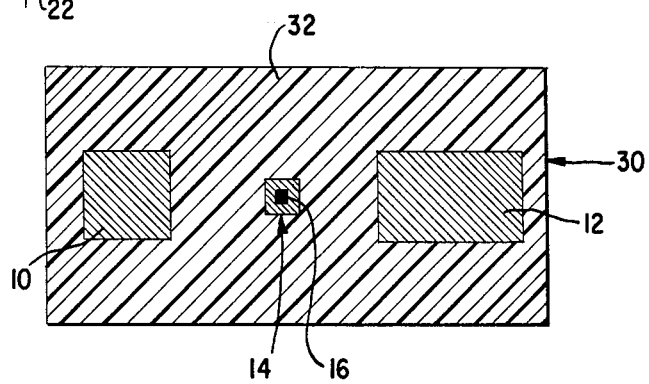
FIG. 2 is a sectional view of reduced size taken on the plan of the line 2—2 of FIG. 1.
Figure 3:
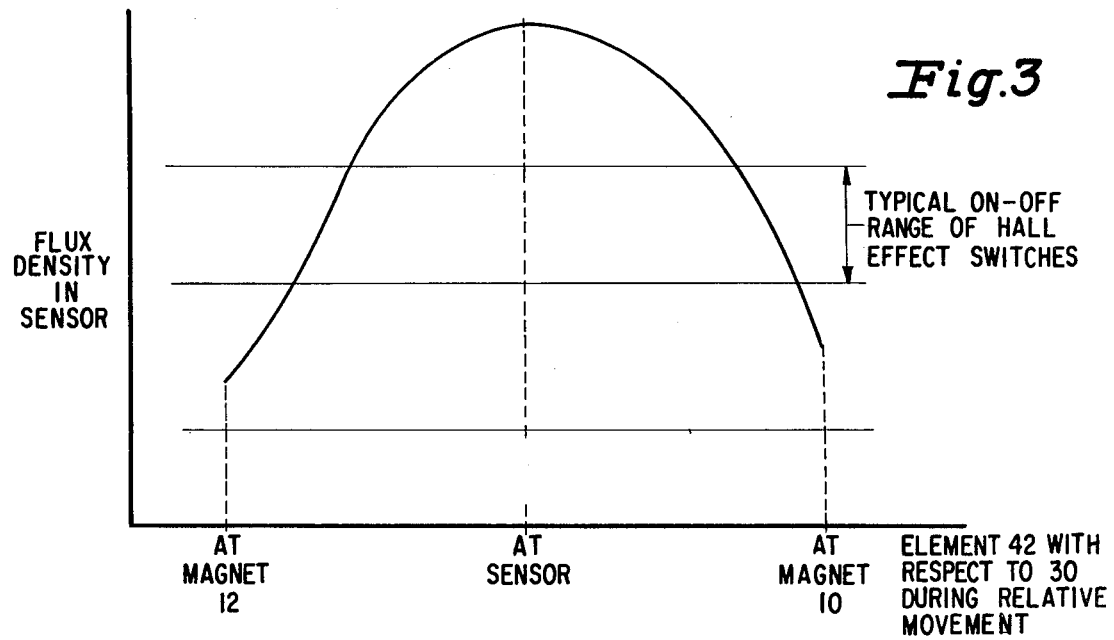
FIG. 3 is a graph indicating flux density variations experienced during motion of the device of the invention in the presence of a ferrous element.

Net flux density in the Hall element is a minimum in the absence of a ferrous element in the vicinity of the sensor but increases in the presence of such element. Assuming a ferrous element 42 under magnet 12, then upon relative movement of the device 30 and element 42 in a direction parallel to the axis 24, as for example upon movement of the device to the right as viewed in FIG. 1, flux density in the Hall element 16 is caused to increase such as in the manner of FIG. 3 as the sensor and element 42 approach each other. Such flux density attains a maximum value as the sensor 14 and ferrous element 42 pass each other and decreases thereafter. As may be seen in FIG. 2 the flux change occuring during the relative movement of device 30 and element 42 is markedly greater than that required for turning a Hall effect solid state switch on and off. The marked change in flux experienced as the device 30 and the element 42 pass each other is reflected in the output voltage across leads 36 and 38 and the device is therefore a very sensitive indicator suitable for use in monitoring the relative movement of ferrous parts.

Although the invention has been described with a certain degree of particularity, it is to be understood that the present disclosure of the preferred form has been made by way of example and that numerous changes in the details of construction and combination and arrangement of parts may be resorted to without departing from the spirit and scope of the invention.

Having thus set forth the nature of this invention, what we hereinafter claim is:

1. The combination comprising a pair of permanent bar magnets and a solid state Hall effect sensor including input and output leads, the magnets and sensor being disposed in fixed spatial relationship and held in assembled relationship in a binder, the sensor being located between the magnets in a position wherein the broad plane of the sensor is parallel to an exposed surface of the binder and the magnets having their axes mutually perpendicular but parallel and perpendicular respectively with respect to said plane of the sensor in positions wherein flux from the magnets at least partially cancelling in the sensor, and a ferrous element relatively movable with respect to the sensor and magnets in a direction parallel to the broad plane of the sensor and effectively thereby to control voltage across the output leads during the application of a constant voltage to the input leads.

2. The combination of claim 1 wherein the Hall effect sensor is a digital output sensor.

3. The combination of claim 1 wherein the Hall effect sensor is a linear output sensor.

4. The combination of claim 1 wherein the magnets are of unequal strength.

5. The combination of claim 1 with a pole of one of the magnets and the sensor in close proximity and parallel to said exposed surface of the binder, the axis of the other magnet being offset substantially from the plane of the sensor, and the magnets being of unequal strength.

* * * * *